(12) United States Patent
Kim et al.

(10) Patent No.: US 12,225,634 B2
(45) Date of Patent: Feb. 11, 2025

(54) SUBSTRATE HEATING APPARATUS AND METHOD FOR PROCESSING A SUBSTRATE

(71) Applicant: SAMSUNG ELECTRONICS CO., LTD., Suwon-si (KR)

(72) Inventors: Taehong Kim, Seoul (KR); Younghoo Kim, Yongin-si (KR); Sunghyun Park, Gyeonggi-do (KR); Kuntack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 837 days.

(21) Appl. No.: 17/348,753

(22) Filed: Jun. 15, 2021

(65) Prior Publication Data

US 2022/0159788 A1    May 19, 2022

(30) Foreign Application Priority Data

Nov. 16, 2020 (KR) ........................ 10-2020-0152793

(51) Int. Cl.
  *H01L 21/67* (2006.01)
  *H01L 21/687* (2006.01)
  *H05B 1/02* (2006.01)

(52) U.S. Cl.
  CPC ........ *H05B 1/023* (2013.01); *H01L 21/67115* (2013.01); *H01L 21/68785* (2013.01)

(58) Field of Classification Search
  CPC ........ H01L 21/67115; H01L 21/68728; H01L 21/6875; H01L 21/68785; H05B 1/023; H05B 3/0047
  USPC .................................................. 392/416–428
  See application file for complete search history.

(56) References Cited

U.S. PATENT DOCUMENTS

| | | | | |
|---|---|---|---|---|
| 3,717,743 A | * | 2/1973 | Costello | ............ H01L 21/67144 |
| | | | | 219/85.13 |
| 6,028,762 A | * | 2/2000 | Kamitani | ............... H02N 13/00 |
| | | | | 279/128 |
| 10,490,427 B2 | | 11/2019 | Choi et al. | |
| 2016/0102396 A1 | | 4/2016 | Wu et al. | |

(Continued)

FOREIGN PATENT DOCUMENTS

| | | |
|---|---|---|
| KR | 20100028752 | 3/2010 |
| KR | 10-1543699 | 8/2015 |
| KR | 20160042570 | 4/2016 |

(Continued)

*Primary Examiner* — Sang Y Paik

(74) *Attorney, Agent, or Firm* — F. CHAU & ASSOCIATES, LLC

(57) ABSTRACT

A substrate heating apparatus includes: a plurality of heating lamps disposed on a chuck stage; a window disposed on the chuck stage and including a window base and a central lens, wherein the chuck stage and the window are each configured to support a substrate above the heating lamps; and a mirror disposed between the heating lamps and the chuck stage, the mirror including a mirror base, a central reflector, and an edge reflector, wherein the plurality of heating lamps are configured to heat the substrate by emitting light through the window onto the substrate and emitting light onto the mirror, wherein the mirror is configured to reflect the light through the window onto the substrate, including reflecting portions of the light via the central and edge reflectors, and wherein the central lens is configured to focus the light onto the central portion of the substrate.

20 Claims, 9 Drawing Sheets

(56) References Cited

U.S. PATENT DOCUMENTS

2019/0311923 A1* 10/2019 Kim .................... H01L 21/6708

FOREIGN PATENT DOCUMENTS

| KR | 10-1681183  | 12/2016 |
| KR | 10-2003848  | 7/2019  |
| KR | 10-2037908  | 10/2019 |
| KR | 20190117373 | 10/2019 |
| KR | 20190132740 | 11/2019 |
| KR | 10-2054222  | 12/2019 |

* cited by examiner

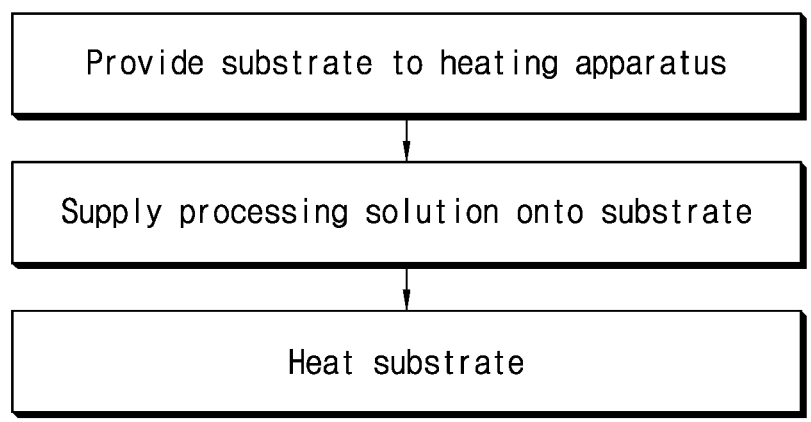

SUBSTRATE HEATING APPARATUS AND METHOD FOR PROCESSING A SUBSTRATE

CROSS-REFERENCE TO RELATED APPLICATIONS

This application claims priority under 35 U.S.C. § 119 to Korean Patent Application No. 10-2020-0152793, filed on Nov. 16, 2020, in the Korean Intellectual Property Office, the disclosure of which is incorporated by reference herein in its entirety.

TECHNICAL FIELD

Embodiments of the present inventive concept relate to a substrate heating apparatus including a window and a mirror and a substrate processing apparatus including the same.

DISCUSSION OF THE RELATED ART

A substrate processing apparatus may include a substrate heating apparatus. A substrate heating apparatus may heat a substrate by irradiating the substrate with light. Heating a substrate may enhance an etching rate of the substrate.

SUMMARY

Embodiments of the present inventive concept provide a substrate heating apparatus including a window having a lens and a mirror having a reflector, a substrate processing apparatus including the same, and a method for processing a substrate.

According to an embodiment of the inventive concept, a substrate heating apparatus includes: a chuck stage including a central axis; a plurality of heating lamps disposed on the chuck stage concentrically around the central axis, wherein each of the plurality of heating lamps has a ring shape; a window disposed on the chuck stage, the window including a window base and a central lens disposed in at least one of an upper surface or a lower surface of a central portion of the window base, wherein the chuck stage and the window are each configured to support a substrate above the heating lamps; and a mirror disposed between the heating lamps and the chuck stage, the mirror including a mirror base, a central reflector disposed on the mirror base and adjacent to a heating lamp, and an edge reflector disposed on an edge portion of the mirror base and adjacent to a heating lamp, wherein the plurality of heating lamps are configured to heat the substrate by emitting first light through the window onto the substrate and emitting second light onto the mirror, wherein the mirror is configured to reflect the second light through the window onto the substrate, including reflecting a central portion of the second light via the central reflector through the window onto a central portion of the substrate and reflecting an edge portion of the second light through the window onto an edge portion of the substrate, and wherein the central lens is configured to focus a first portion of the first light and a first portion of the second light onto the central portion of the substrate.

According to an embodiment of the inventive concept, a substrate heating apparatus includes: a chuck stage including a central axis; a plurality of heating lamps disposed on the chuck stage concentrically around the central axis, wherein each of the plurality of heating lamps has a ring shape; a window disposed on the chuck stage, the window including a window base and a concave lens disposed on at least one of an upper surface or a lower surface of the window base, wherein the chuck stage and the window are each configured to support a substrate above the heating lamps; and a mirror disposed between the heating lamps and the chuck stage, the mirror including a mirror base, a central reflector disposed on the reflection base and an edge reflector disposed on an edge portion of the reflection base, wherein the plurality of heating lamps are configured to heat the substrate by emitting first light through the window onto the substrate and emitting second light onto the mirror, wherein the mirror is configured to reflect the second light through the window onto the substrate, including reflecting a central portion of the second light through the window onto a central portion of the substrate and reflecting an edge portion of the second light through the window onto an edge portion of the substrate, and wherein the concave lens is configured to distribute portions of the first light and second light directed towards a region of the substrate between the central portion and the edge portion of the substrate to the central portion and the edge portion of the substrate.

According to an embodiment of the inventive concept, a substrate processing method includes: providing a substrate onto a substrate heating apparatus included in a substrate processing apparatus, the substrate heating apparatus including: a plurality of heating lamps; a window including a window base and a central lens disposed in at least one of an upper surface or a lower surface of a central portion of the window base, wherein the window supports the substrate above the heating lamps; and a mirror disposed below the heating lamps, the mirror including a mirror base, a central reflector disposed on the mirror base, and an edge reflector disposed on an edge portion of the mirror base; supplying a processing solution onto the substrate by a solution supply assembly included in the substrate processing apparatus; and heating the substrate, wherein the heating the substrate includes: emitting first light via the plurality of heating lamps onto the substrate through the window; emitting second light via the plurality of heating lamps onto the mirror; reflecting the second light via the mirror through the window onto the substrate, including reflecting a central portion of the second light via the central reflector through the window onto a central portion of the substrate and reflecting an edge portion of the second light via the edge reflector through the window onto an edge portion of the substrate; and focusing a first portion of the first light and a first portion of the second light via the central lens onto the central portion of the substrate.

BRIEF DESCRIPTION OF THE DRAWINGS

The above and other features of the present inventive concept will become more apparent by describing in detail embodiments thereof with reference to the accompanying drawings, in which:

FIG. 10 is a flowchart illustrating a method for processing a substrate according to an embodiment of the inventive concept.

DETAILED DESCRIPTION

Figure 1:
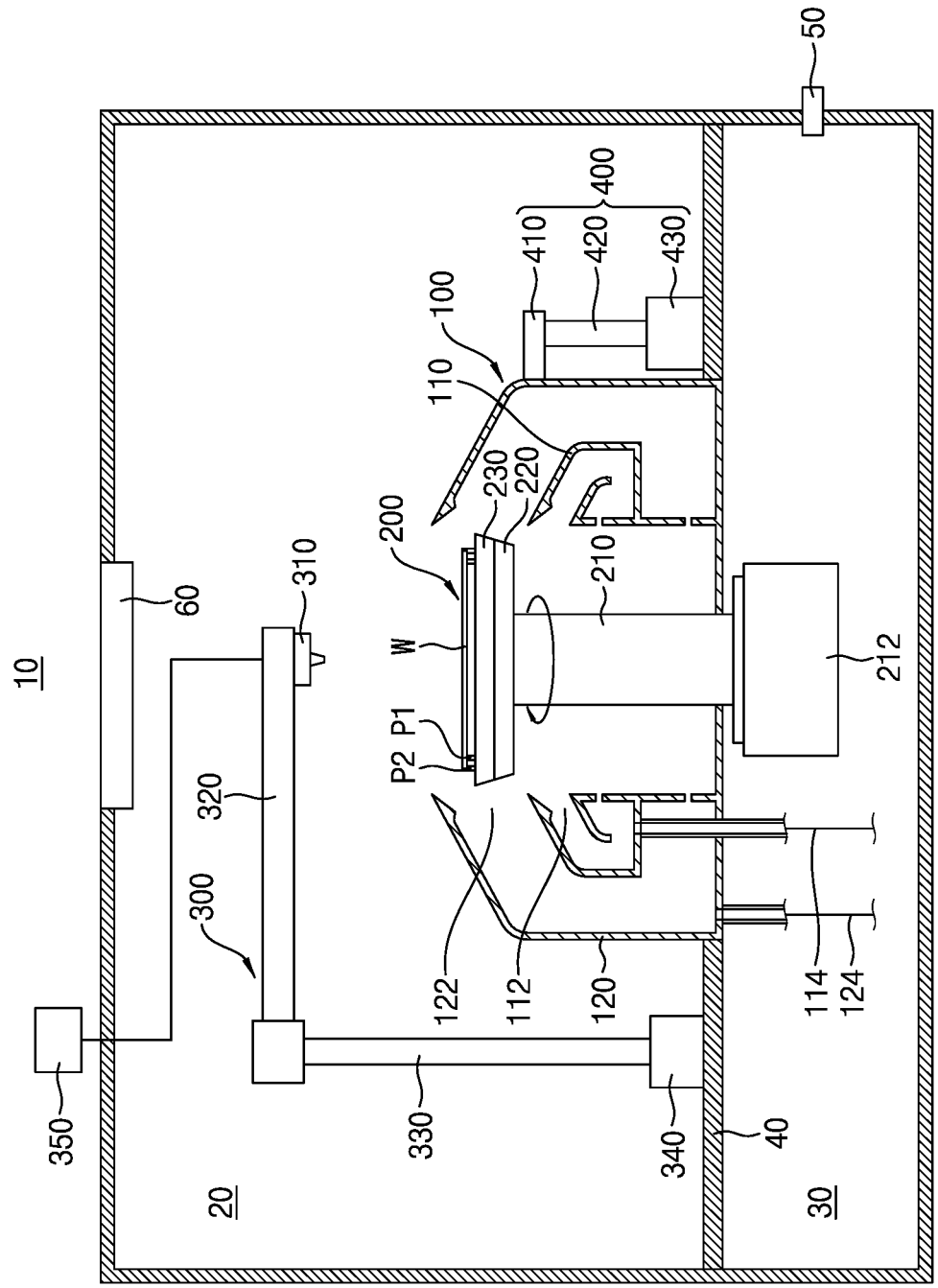
FIG. 1 illustrates a substrate processing apparatus according to an embodiment of the inventive concept.

Embodiments of the present inventive concept will be described more fully hereinafter with reference to the accompanying drawings. Like reference numerals may refer to like elements throughout the accompanying drawings.

It will be understood that when a component, such as a film, a region, a layer, or an element is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements should be interpreted in a like fashion.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the apparatus in use or operation in addition to the orientation depicted in the figures. For example, if the apparatus in the figures is turned over, elements described as "below" or "beneath" other elements or features would then be oriented "above" the other elements or features. Thus, the term "below" can encompass both an orientation of above and below. The apparatus may be otherwise oriented (rotated 90 degrees or at other orientations) and the spatially relative descriptors used herein interpreted accordingly.

Embodiments of the inventive concept are described herein with reference to cross-sectional illustrations that are schematic illustrations of idealized embodiments (and intermediate structures) of embodiments. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing, as would be understood by a person having ordinary skill in the art.

Figure 2:
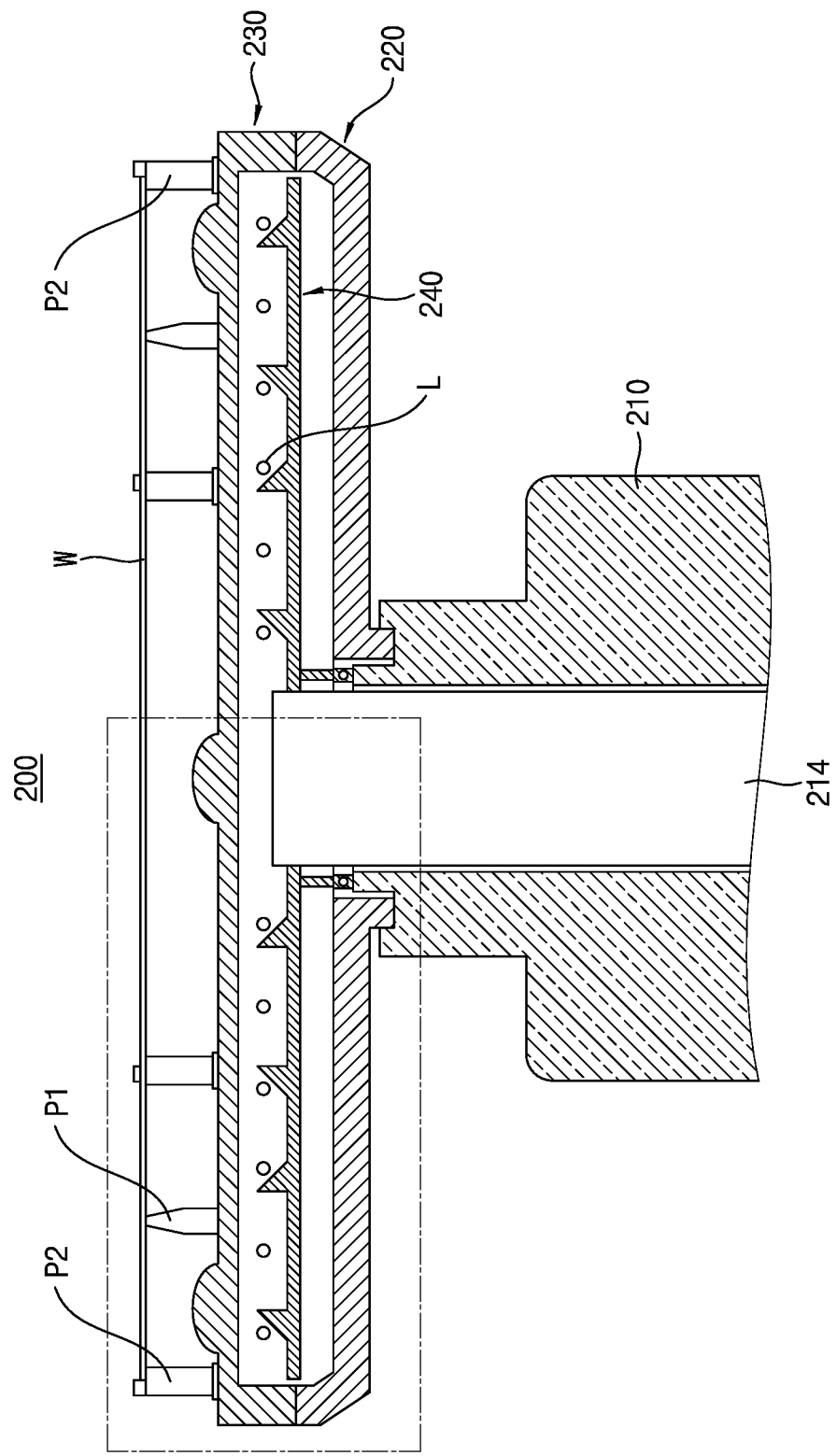
FIG. 2 is a cross-sectional view of the substrate support assembly and the substrate heating apparatus of FIG. 1.

FIG. 1 illustrates a substrate processing apparatus according to an embodiment of the inventive concept. FIG. 2 shows a substrate support assembly and a substrate heating apparatus of FIG. 1.

Referring to FIG. 1, a substrate processing apparatus 10 may include a processing area 20, a maintenance/repair area 30, a partition wall 40, a discharge port 50, and an air supply unit 60. In the processing area 20, processing such as heating, etching, etc. of a substrate W may be performed. In the maintenance/repair area 30, gas, etc. produced in the processing area 20 may be discharged through the discharge port 50. The partition wall 40 may separate the processing area 20 and the maintenance/repair area 30 from each other. The air supply unit 60 may supply ambient air to the processing area 20 after filtering the ambient air.

The substrate processing apparatus 10 may include a processing vessel 100, a substrate support assembly 200, a solution supply assembly 300, and a lifting assembly 400, which may each be disposed at least partially in the processing area 20. The processing vessel 100 may be opened at a top portion thereof, and may include an inner recovery box 110 and an outer recovery box 120. The inner recovery box 110 may at least partially surround the substrate support assembly 200, and the outer recovery box 120 may at least partially surround the inner recovery box 110. An inner space 112 of the inner recovery box 110 and a space 122 disposed between the inner recovery box 110 and the outer recovery box 120 may each function as introduction ports through which a chemical solution is introduced into the inner recovery box 110 and the outer recovery box 120, respectively. Recovery lines 114 and 124 may be connected to bottoms of the inner recovery box 110 and the outer recovery box 120, respectively. A chemical solution introduced into each of the recovery lines 114 and 124 may be reused.

The substrate support assembly 200 may be disposed within the processing vessel 100, and may support a substrate W. The substrate support assembly 200 may include a support shaft 210, a driver 212, and a substrate heating apparatus. Further referring to FIG. 2, the substrate heating apparatus may include a chuck stage 220, a plurality of heating lamps L, a window 230, and a mirror 240.

The support shaft 210 may be connected to the driver 212, and may include a rotating shaft 214 therein. The support shaft 210 may extend vertically, and may be disposed below the chuck stage 220 in the processing area 20. The driver 212 may be disposed in the maintenance/repair area 30, and may rotate the support shaft 210 through a rotating shall 214 in a horizontal direction.

As described above, the substrate heating apparatus may include the chuck stage 220, the plurality of heating lamps L, the window 230, and the mirror 240. The chuck stage 220 may be disposed on the support shaft 210, and may be coupled to the support shaft 210 such that the chuck stage 220 is rotated in a horizontal direction by the rotating shaft 214. The chuck stage 220 may have a disc shape at least partially surrounding the rotating shaft 214.

The plurality of heating lamps L may be disposed on the chuck stage 220. For example, the plurality of heating lamps L may be disposed between the window 230 and the mirror 240. The plurality of heating lamps L may extend in a circumferential direction, and may each have, for example, a ring or donut shape. The plurality of heating lamps L may be concentrically disposed. For example, the plurality of heating lamps L may extend in a circumferential direction with reference to a central axis of the substrate W or the chuck stage 220. In an embodiment, the plurality of heating lamps L may emit light onto the substrate W through the window 230 and onto the mirror 240, which may then reflect the emitted light through the window 230 onto the substrate W, thereby heating the substrate W and, as such, may increase an etching rate in a substrate etching process.

The window 230 may be disposed on the chuck stage 220, and may transmit light emitted from the plurality of heating lamps L therethrough such that the emitted light reaches the substrate W. In an embodiment, the window 230 may include a material such as quartz. The mirror 240 may be disposed between the chuck stage 220 and the plurality of heating lamps L. The mirror 240 may reflect light emitted from the plurality of heating lamps L onto the substrate W through the window 230, which may increase the efficiency of the substrate heating apparatus, more uniformly heat the substrate W, and prevent the chuck stage 220 from being heated by the emitted light. The mirror 240 may be supported by the rotating shaft 214.

The substrate support assembly 200 may further include a support pin P1 and a chuck pin P2, which are configured to support the substrate W. The support pin P1 may be disposed on the window 230, and may protrude vertically from the window 230, thereby supporting a lower surface of the substrate W. The chuck pin P2 may extend through the window 230 such that the chuck pin P2 protrudes upwards from the window 230. The chuck pin P2 may be disposed at an edge portion of the window 230 such that the chuck pin P2 supports the lower surface of the substrate W and a side surface of the substrate W.

The solution supply assembly 300 may be at least partially disposed in the processing area 20, and may include a nozzle 310, a first support shaft 320, a second support shaft 330, a driver 340, and a solution dispenser 350. The nozzle 310 may provide a processing solution to an upper surface of the substrate W. The first support shaft 320 may extend horizontally from the second support shaft 330, thereby supporting the nozzle 310. The driver 340 may rotate and vertically move the second support shaft 330. The solution dispenser 350 may be connected to the nozzle 310, and may dispense the processing solution to the nozzle 310.

The lifting assembly 400 may include a bracket 410, a movable shaft 420, and a driver 430. The bracket 410 may be fixed to an outer wall of the processing vessel 100, and may be connected to the movable shaft 420. The movable shaft 420 may be vertically movable by the driver 430. The lifting assembly 400 may vertically move the processing vessel 100, thereby adjusting a distance between the nozzle 310 and the substrate W.

Figure 3:
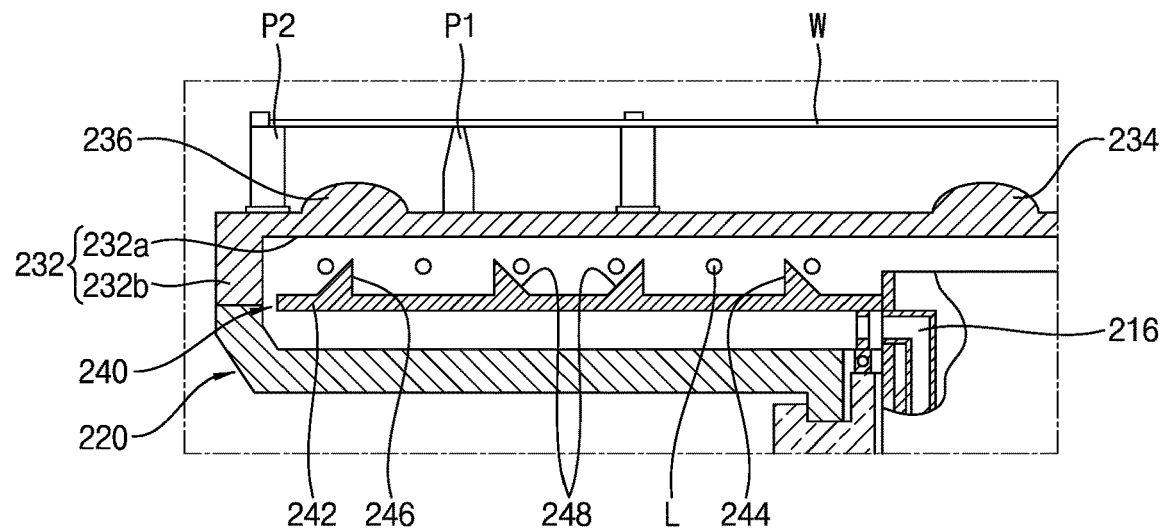
FIG. 3 is an enlarged view of an area of the substrate heating apparatus of FIG. 2.

FIG. 3 is an enlarged view of an area of the substrate heating apparatus of FIG. 2.

Referring to FIG. 3, the window 230 may include a window base 232, a first central lens 234, and a first edge lens 236. The mirror 240 may include a mirror base 242, a central reflector 244, an edge reflector 246, and a reflector 248.

The window base 232 may include a horizontal portion 232a and a support portion 232b. The horizontal portion 232a may extend horizontally, and may have, for example, a disc shape. The support portion 232b may be connected to an edge of the horizontal portion 232a, and may extend vertically such that the support portion 232b contacts the chuck stage 220. The support portion 232b may be formed to be integrated with the horizontal portion 232a. The window 230 may be supported by the support portion 232b such that the window 230 is supported by the chuck stage 220.

The first central lens 234 may be disposed in a central portion of the window base 232. The first central lens 234 may protrude from a surface of the window base 232 and, as such, may have a convex shape. Since the first central lens 234 may have a convex shape, light may be focused onto a portion of the substrate W facing the first central lens 234.

The first edge lens 236 may be disposed in an edge portion of the window base 232. The first edge lens 236 may protrude from a surface of the window base 232, and may have a convex shape. The first edge lens 236 may focus light onto a portion of the substrate W facing the first edge lens 236. Although the first central lens 234 and the first edge lens 236 are illustrated as being disposed in an upper surface of the window base 232 in FIG. 3, the first central lens 234 and the first edge lens 236 are not limited thereto. In an embodiment, the first central lens 234 or the first edge lens 236 may be disposed in a lower surface of the window base 232. In an embodiment, the first edge lens 236 may be disposed in plural. Alternatively, the first central lens 234 or the first edge lens 236 may be omitted. The first central lens 234 and the first edge lens 236 may be formed to be integrated with the window base 232. In an embodiment, the first central lens 234 and the first edge lens 236 may have a height of 3 to 5 mm.

The mirror base 242 of the mirror 240 may extend horizontally, and may have, for example, a ring or donut shape. The central reflector 244, an edge reflector 246, and the reflector 248 may protrude from an upper surface of the mirror base 242. The central reflector 244 may be disposed on a central portion of the mirror base 242, and the edge reflector 246 may be disposed on an edge portion of the mirror base 242. The reflector 248 may be disposed on the mirror base 242 between the central reflector 244 and the edge reflector 246. In an embodiment, each of the central reflector 244, the edge reflector 246, and the reflector 248 may be disposed in plural. In an embodiment, each of the central reflector 244, the edge reflector 246 and the reflector 248 may be disposed adjacent to a heating lamp L. In an embodiment, each of the central reflector 244, the edge reflector 246, and the reflector 248 may diagonally reflect light emitted from an adjacent heating lamp L.

In an embodiment, each of the central reflector 244, the edge reflector 246, and the reflector 248 may have a reflective surface facing an adjacent heating lamp L. Each reflective surface may reflect light emitted from the adjacent heating lamp L onto the substrate W. For example, the central reflector 244 may have a reflective surface facing the central portion of the substrate W and, as such, may reflect light emitted from an adjacent heating lamp L onto the central portion of the substrate W. The edge reflector 246 may have a reflective surface facing the edge portion of the substrate W and, as such, may reflect light emitted from an adjacent heating lamp L onto the edge portion of the substrate W. The reflector 248 may have a reflective surface facing a region between the central portion of the substrate W and the edge portion of the substrate W, and, as such, may reflect light emitted from adjacent heating lamps L onto the region. In an embodiment, each of the central reflector 244, the edge reflector 246, and the reflector 248 may have a triangular cross-section, without being limited thereto. The central reflector 244, the edge reflector 246, and the reflector 248 may be formed to be integrated with the mirror base 242.

An upper surface of the mirror 240 may include a reflective material such as gold, and may include a protective layer for preventing discoloration of the upper surface caused by an etchant. A lower surface of the mirror 240 may include a radiation plate for radiating heat from the mirror 240. The radiation plate may include a material such as aluminum.

The substrate support assembly 200 may further include an injection port 216. The injection port 216 may supply a coolant between the chuck stage 220 and the lower surface of the mirror 240. The coolant may be a cooling liquid such as water, or a cooling gas such as nitrogen or ambient air.

In an embodiment, heating lamps L may be omitted from a central region and an edge region of the chuck stage 220. As a result, a relatively small quantity of light may be emitted from the plurality of heating lamps L onto the central and edge portions of the substrate W. In accordance with an embodiment of the inventive concept, however, the window 230 may include the first central lens 234 and the first edge lens 236, and the mirror 240 may include the central reflector 244, the edge reflector 246, and the reflector 248. Accordingly, the window 230 and the mirror 240 may enable light emitted from the heating lamps L to be reflected and focused onto the central and edge portions of the substrate W and, as such, the substrate W may be uniformly heated. Thus, an enhancement in etching uniformity may be achieved.

Figure 4:
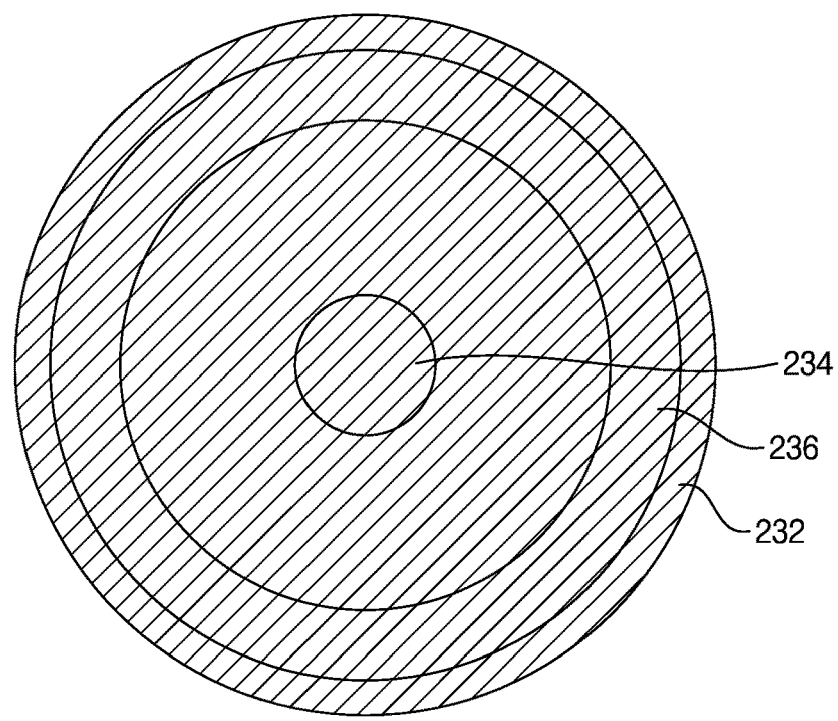
FIG. 4 is a plan view of a window according to an embodiment of the present inventive concept.

FIG. 4 is a plan view of a window according to an embodiment of the inventive concept.

Referring to FIG. 4, the window base 232 may have a circular shape. The first central lens 234 may be disposed at the central portion of the window base 232, and may have a circular shape. In an embodiment, the first edge lens 236 may be disposed at an edge portion of the window base 232, and may extend in a circumferential direction. For example, the first edge lens 236 may have a ring or donut shape.

Referring to FIGS. 1 to 4, the substrate processing apparatus 10 may perform substrate processing using a substrate heating apparatus. For example, a substrate processing method (see FIG. 10) may include providing a substrate W to an interior of the substrate processing apparatus 10, supplying a processing solution onto the substrate W, and heating the substrate W.

Providing the substrate W to the interior of the substrate processing apparatus 10 may include providing the substrate W onto the substrate support assembly 200. For example, the substrate W may be disposed on the substrate heating apparatus including the chuck stage 220 and the window 230. The chuck stage 220 and the window 230 may each support the substrate W. According to an embodiment of the inventive concept, the substrate processing apparatus 10 may be a single type processing apparatus and, as such, the substrate W may be provided to the interior of the substrate processing apparatus 10 on a single-substrate basis, and a substrate processing process may be performed for one substrate W.

Supplying the processing solution onto the substrate W may be performed by the solution supply assembly 300. The solution supply assembly 300 may supply the processing solution onto the substrate W through the nozzle 310 by receiving the processing solution from the solution dispenser 350.

Heating the substrate W may include: emitting light via the plurality of heating lamps L through the window 230 onto the substrate W; emitting light via the plurality of heating lamps L onto the mirror 240; reflecting light via the mirror 240 through the window 230 onto the substrate W, including reflecting light via the central reflector 244 through the window 230 onto the central portion of the substrate W, reflecting light via the edge reflector 246 through the window 230 onto the edge portion of the substrate W, and reflecting light via the reflector 248 through the window 230 onto a portion of the substrate W between the central portion and the edge portion of the substrate W; focusing light via the first central lens 234 onto the central portion of the substrate W; and focusing light via the first edge lens 236 onto the edge portion of the substrate W. As described above, the substrate heating apparatus may increase an etching rate for the substrate by heating the substrate W. In the substrate processing method, the substrate W may be horizontally rotated by the substrate support assembly 200. For example, the chuck stage 220 may rotate horizontally, causing the substrate W, supported by the chuck stage 220, to also rotate horizontally.

The substrate processing method may further include discharging and/or recovering the processing solution and discharging a processed gas. The processing solution may be discharged through the recovery lines 114 and 124. For example, when the processing solution supplied from the solution supply assembly 300 is scattered in the inner space 112 and the space 122, the scattered processing solution may be discharged and/or recovered. The recovered processing solution may be reused. The discharge port 50 may discharge processed gas produced in the substrate processing process to the outside of the substrate processing apparatus 10.

Figure 5A:
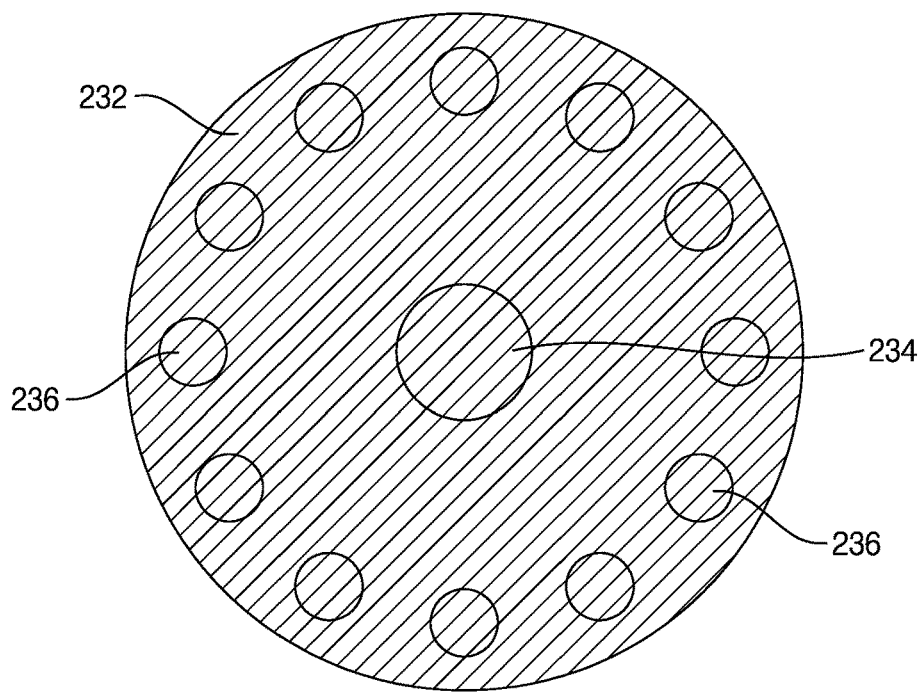
FIGS. 5A and 5B are plan views of a window according to embodiments of the inventive concept.
Figure 5B:
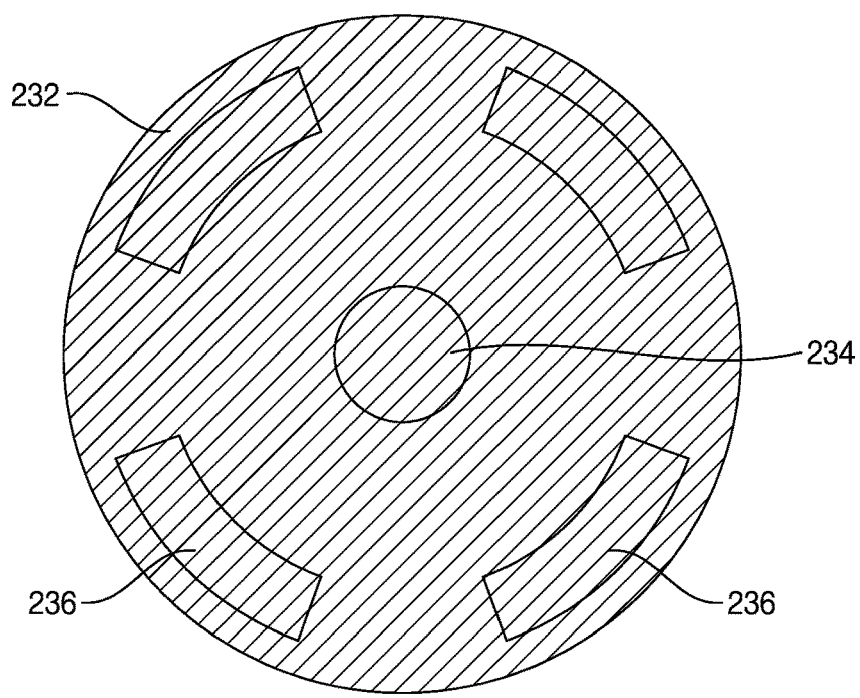

FIGS. 5A and 5B are plan views of a window according to embodiments of the inventive concepts.

Referring to FIG. 5A, a window 230 may include first edge lenses 236 concentrically disposed along an edge portion of a window base 232, spaced apart from one another by a regular interval. In an embodiment, the first edge lenses 236 may each have a circular shape.

Referring to FIG. 5B, a window 230 may include first edge lenses 236 concentrically disposed in an edge portion of a window base 232. In an embodiment, the first edge lenses 236 may extend in a circumferential direction. For example, each first edge lens 236 may have a divided ring or donut shape, or an arc shape, having a predetermined thickness.

FIGS. 6A to 6G are cross-sectional views of a window according to embodiments of the inventive concept.

Figure 6A:
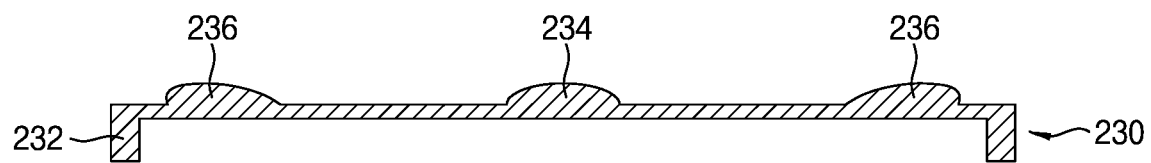
FIGS. 6A to 6G are cross-sectional views of a window according to embodiments of the inventive concept.

Referring to FIG. 6A, a window 230 may include a first central lens 234 and a first edge lens 236, which are disposed in an upper surface of a window base 232. The first edge lens 236 may be formed such that a slope of an inner portion thereof is gentler than that of an outer portion thereof. For example, the first edge lens 236 may have a round cross-section, and a curvature of a portion of the first edge lens 236 near to a central portion of the window base 232 may be smaller than a curvature of a portion of the first edge lens 236 near an edge portion of the window base 232.

Figure 6B:
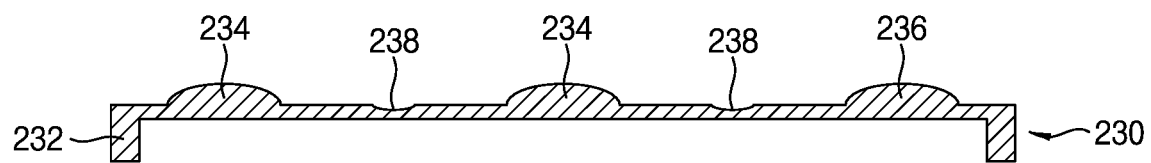

Referring to FIG. 6B, a window 230 may include a first lens 238 disposed in an upper surface of a window base 232. The first lens 238 may be disposed between a first central lens 234 and first edge lens 236. The first lens 238 may provide for uniform heating of the substrate W. For example, the first lens 238 may have a concave cross-section, and may distribute, to central and edge portions of the substrate W, light from heating lamps L emitted towards a region between the central and edge portions of the substrate W. As described with reference to FIGS. 4, 5A, and 5B, the first lens 238 may extend in a circumferential direction. Although the window 230 is illustrated as including the first central lens 234, the first edge lens 236, and the first lens 238 in FIG. 6B, the window 230 is not limited thereto. The window 230 may include any combination of the first central lens 234, the first edge lens 236, and the first lens 238.

Figure 6C:
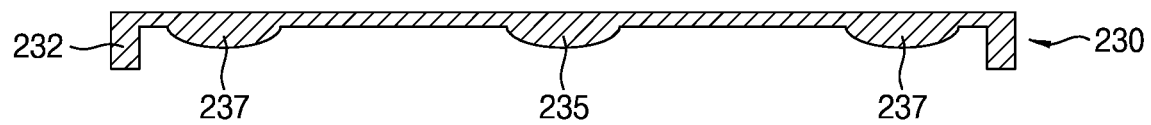

Referring to FIG. 6C, a window 230 may include a second central lens 235 and a second edge lens 237, which are disposed in a lower surface of a window base 232. The second central lens 235 and the second edge lens 237 may protrude from a lower surface of a window base 232, and may have a convex shape. The second central lens 235 may focus light onto a portion of a substrate W facing the second central lens 235, whereas the second edge lens 237 may focus light onto a portion of the substrate W facing the second edge lens 237.

Figure 6D:
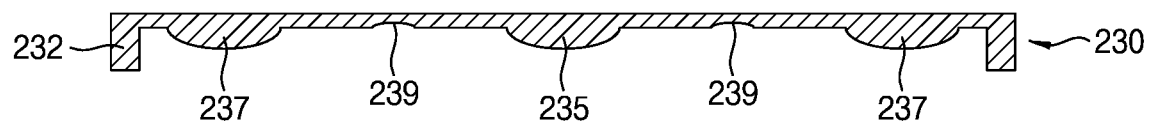

Referring to FIG. 6D, a window 230 may include a second central lens 235, a second edge lens 237, and a second lens 239, which are disposed in a lower surface of a window base 232. The second lens 239 may be disposed between the second central lens 235 and the second edge lens 237.

Figure 6E:
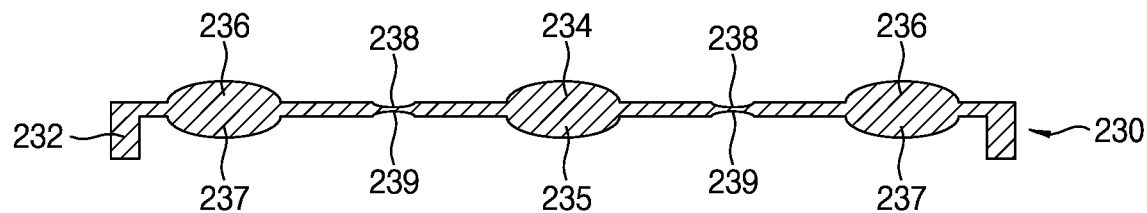

Referring to FIG. 6E, a window 230 may include a first central lens 234, a first edge lens 236, and a first lens 238, which are disposed in an upper surface of a window base 232, and a second central lens 235, a second edge lens 237, and a second lens 239, which are disposed in a lower surface of the window base 232. The second central lens 235, the second edge lens 237, and the second lens 239 may vertically overlap with the first central lens 234, the first edge lens 236, and the first lens 238, respectively, without being limited thereto. In an embodiment, sizes of the second central lens 235, the second edge lens 237, and the second lens 239 may be different from sizes of the first central lens 234, the first edge lens 236, and the first lens 238, respectively.

Although the window 230 is illustrated as including the first central lens 234, the first edge lens 236, the first lens 238, the second central lens 235, the second edge lens 237, and the second lens 239 in FIG. 6E, the window 230 is not limited thereto. The window 230 may include any combination of the first central lens 234, the first edge lens 236, the first lens 238, the second central lens 235, the second edge lens 237, and the second lens 239.

Figure 6F:
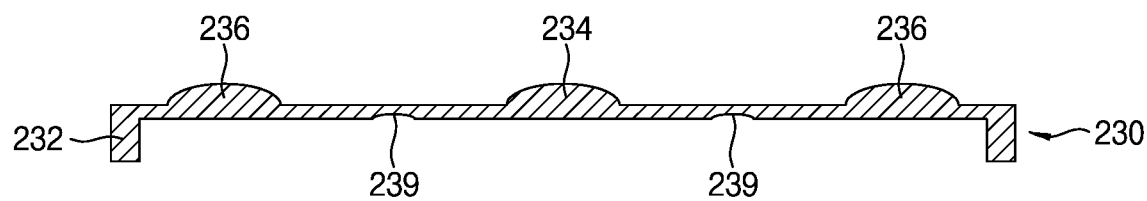

For example, referring to FIG. 6F, the window 230 may include the first central lens 234, the first edge lens 236, and the first lens 238, which are disposed in the upper surface of the window base 232, and the second lens 239 disposed in the lower surface of the window base 232.

Figure 6G:
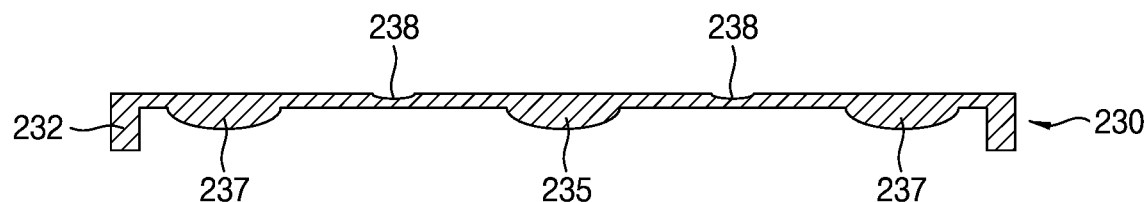

Referring to FIG. 6G, the window 230 may include the first lens 238 disposed in the upper surface of the window base 232, and the second central lens 235 and the second edge lens 237, which are disposed in the lower surface of the window base 232.

Figure 7:
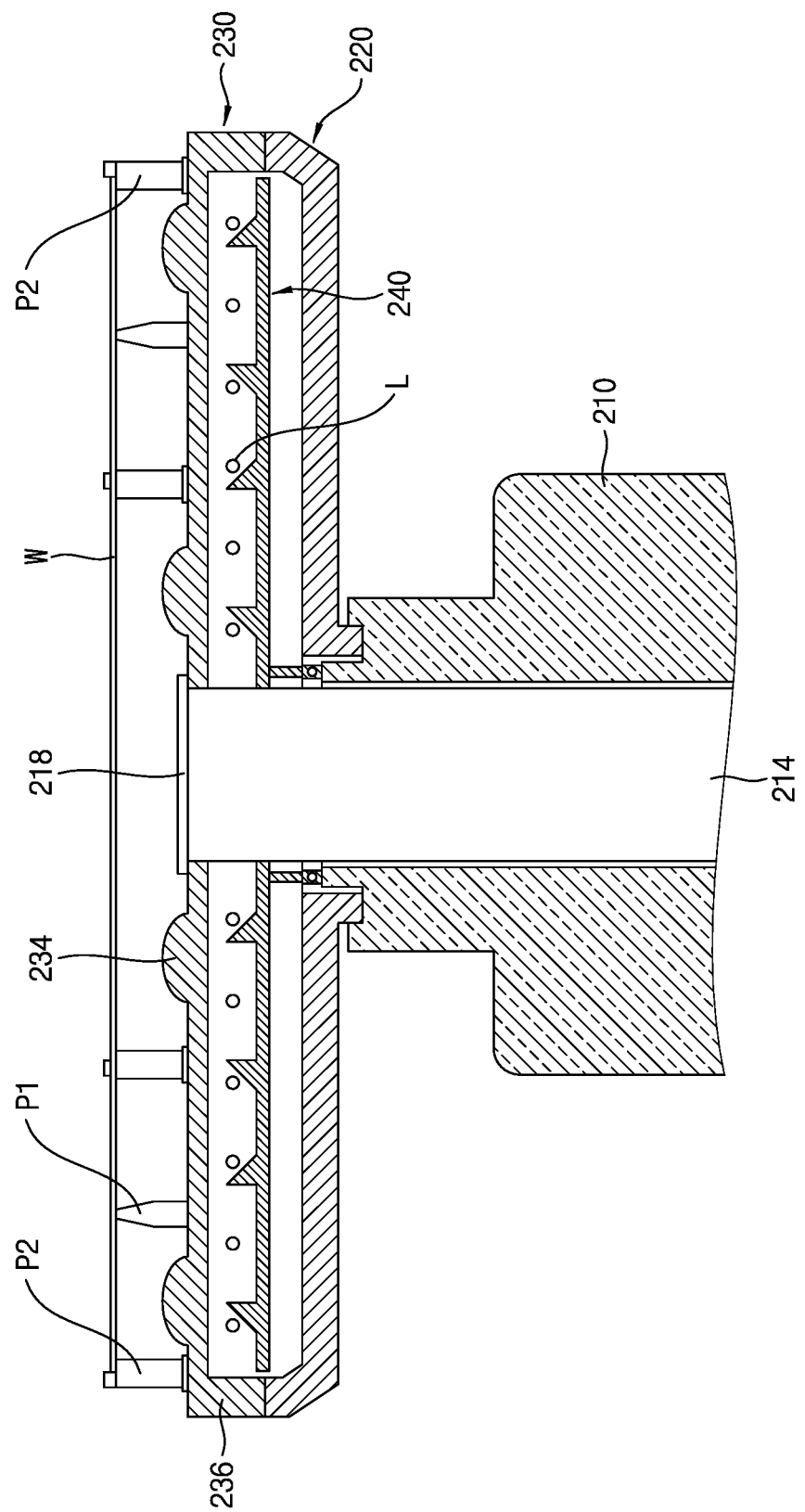
FIG. 7 is a cross-sectional view of a substrate support assembly and a substrate heating apparatus according to an embodiment of the inventive concept.

FIG. 7 is a cross-sectional view of a substrate support assembly and a substrate heating apparatus according to an embodiment of the inventive concept.

Referring to FIG. 7, the support shaft 210 may further include a nozzle 218 centrally disposed at an upper portion of the window 230. The nozzle 218 may extend upwards beyond the upper portion of the window 230 connected to the nozzle 218. The nozzle 218 may protrude upwards beyond an upper surface of the window 230. The nozzle 218 may inject a chemical solution or gas onto a back surface of a substrate W.

The window 230 may have a ring or donut shape at a central portion thereof. The window 230 may include a first central lens 234. The first central lens 234 might not face a central portion of the substrate W. For example, the first central lens 234 may face a portion of the substrate W adjacent to the central portion of the substrate W. and may at least partially surround a central portion of a window base 232. The first central lens 234 may extend in a circumferential direction. Alternatively, a plurality of first central lenses 234 may be uniformly disposed apart from one another by a regular interval in a circumferential direction.

Figure 8:
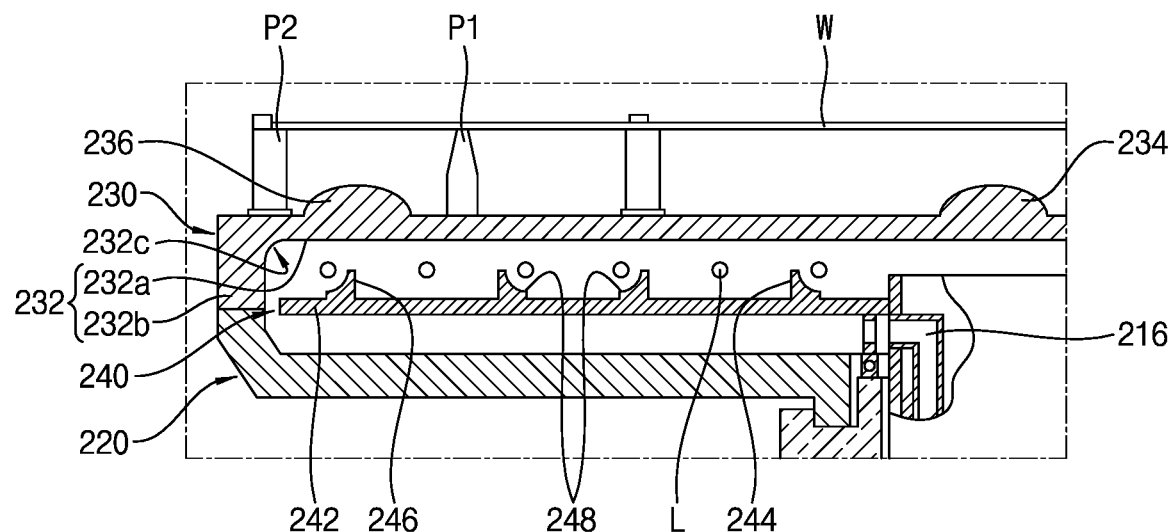
FIGS. 8 and 9 are enlarged views of an area of a substrate heating apparatus according to embodiments of the inventive concept.
Figure 9:
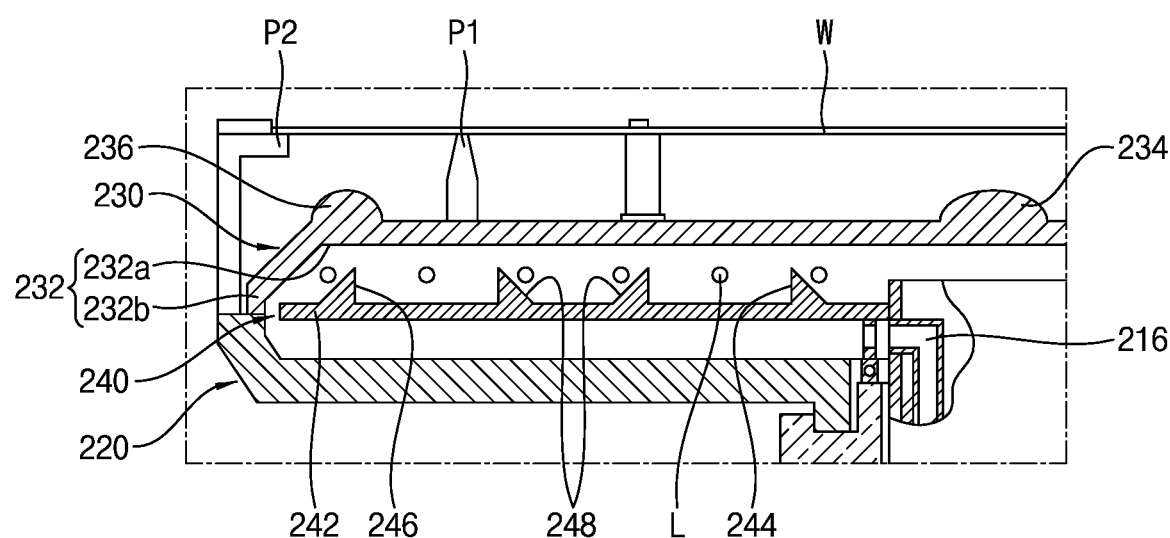

FIGS. 8 and 9 are enlarged views of a substrate heating apparatus according to embodiments of the inventive concepts.

Referring to FIG. 8, a mirror 240 may include a central reflector 244, an edge reflector 246, and reflector 248, which are disposed on an upper surface of a mirror base 242. Each of the central reflector 244, the edge reflector 246, and the reflector 248 may have reflective surfaces facing heating lamps L disposed adjacent thereto. In an embodiment, the reflective surfaces may be round.

In an embodiment, in a window 230, an inner corner 232c joining a horizontal portion 232a and a support portion 232b may be round. For example, the inner corner 232c may include a curved surface having a radius of curvature of less than 0.5 mm. As the inner corner 232c of the window 230 is round, it may be possible to prevent or reduce diffuse reflection of light emitted from the heating lamps L and reflected by the edge reflector 246.

Referring to FIG. 9, a window 230 may include a horizontal portion 232a extending horizontally, and a support portion 232b connected to the horizontal portion 232a while being supported by a chuck stage 220. In an embodiment, the support portion 232b may extend diagonally. For example, the horizontal portion 232a and the support portion 232b may meet at an angle of less than 90°. A chuck pin P2, which supports an edge portion of a substrate W, may extend vertically such that the chuck pin P2 is supported by the chuck stage 220. As the support portion 232b may be diagonally formed, as shown in FIG. 9, it may be possible to prevent or reduce diffuse reflection of light emitted from the heating lamps L and reflected by an edge reflector 246.

In accordance with embodiments of the inventive concept, the lenses of the window and the reflectors of the mirror may achieve uniform heating of a substrate.

While embodiments of the inventive concept have been described with reference to the accompanying drawings, it should be understood by those skilled in the art that various transitions may be made without departing from the scope of the disclosure and without changing essential features thereof.

What is claimed is:
1. A substrate heating apparatus comprising:
a support shaft extending in a first direction;
a chuck stage including a central axis, wherein the chuck stage is disposed on and coupled to the support shaft;
a plurality of heating lamps disposed on the chuck stage concentrically around the central axis, wherein each of the plurality of heating lamps has a ring shape;
a window disposed on the chuck stage, the window including a window base and a central lens disposed in at least one of an upper surface or a lower surface of a central portion of the window base, wherein the central lens at least partially overlaps the support shaft in the first direction and wherein the chuck stage and the window are each configured to support a substrate above the plurality of heating lamps; and
a mirror disposed between the plurality of heating lamps and the chuck stage, the mirror including a mirror base, a central reflector disposed on the mirror base and adjacent to a heating lamp, and an edge reflector disposed on an edge portion of the mirror base and adjacent to a heating lamp, wherein the plurality of heating lamps are configured to heat the substrate by emitting first light through the window onto the substrate and emitting second light onto the mirror, wherein the mirror is configured to reflect the second light through the window onto the substrate, including reflecting a central portion of the second light via the central reflector through the window onto a central portion of the substrate and reflecting an edge portion of the second light through the window onto an edge portion of the substrate, and wherein the central lens is configured to focus a first portion of the first light and a first portion of the second light onto the central portion of the substrate.

2. The substrate heating apparatus according to claim 1, wherein the window further includes an edge lens disposed in at least one of an upper surface or a lower surface of an edge portion of the window base, and wherein the edge lens is configured to focus a second portion of the first light and a second portion of the second light onto the edge portion of the substrate.

3. The substrate heating apparatus according to claim 2, wherein the edge lens has a ring shape.

4. The substrate heating apparatus according to claim 1, wherein the central lens has a circular shape.

5. The substrate heating apparatus according to claim 1, wherein the central reflector includes a reflective surface facing the central portion of the substrate.

6. The substrate heating apparatus according to claim 1, wherein the edge reflector includes a reflective surface facing the edge portion of the substrate.

7. The substrate heating apparatus according to claim 1, wherein the mirror further includes an additional reflector disposed between the central reflector and the edge reflector, and wherein the mirror is configured to reflect the second light through the window onto the substrate, including reflecting a portion of the second light via the additional reflector through the window onto a portion of the substrate between the edge portion and the central portion of the substrate.

8. The substrate heating apparatus according to claim 1, wherein each of the central reflector and the edge reflector include reflective surfaces, and wherein the reflective surfaces of the central reflector and the edge reflector are round.

9. The substrate heating apparatus according to claim 1, wherein the window base has a ring shape and the central lens extends in a circumferential direction and surrounds the central portion of the window base.

10. The substrate heating apparatus according to claim 1, wherein the window base includes a horizontal portion extending horizontally and a support portion extending vertically from the horizontal portion and supported by the chuck stage, and wherein an inner corner of the window base joining the horizontal portion and the support portion includes a curved surface having a radius of curvature of less than 0.5 mm.

11. The substrate heating apparatus according to claim 1, wherein the window base includes a horizontal portion extending horizontally and a support portion extending diagonally from the horizontal portion and supported by the chuck stage.

12. A substrate processing method comprising:
providing a substrate onto a substrate heating apparatus comprised in a substrate processing apparatus, the substrate heating apparatus including:
a plurality of heating lamps,
a window including a window base and a central lens disposed in at least one of an upper surface or a lower surface of a central portion of the window base, wherein the window supports the substrate above the plurality of heating lamps and wherein the central lens is spaced apart from the substrate, and
a mirror disposed below the plurality of heating lamps, the mirror including a mirror base, a central reflector disposed on the mirror base, and an edge reflector disposed on an edge portion of the mirror base;
supplying a processing solution onto the substrate by a solution supply assembly comprised in the substrate processing apparatus; and
heating the substrate, wherein the heating the substrate comprises:
emitting first light via the plurality of heating lamps onto the substrate through the window,
emitting second light via the plurality of heating lamps onto the mirror,
reflecting the second light via the mirror through the window onto the substrate, including reflecting a central portion of the second light via the central reflector through the window onto a central portion of the substrate and reflecting an edge portion of the second light via the edge reflector through the window onto an edge portion of the substrate, and
focusing a first portion of the first light and a first portion of the second light via the central lens onto the central portion of the substrate.

13. The substrate processing method according to claim 12, wherein the window base further includes an edge lens disposed on at least one of an upper surface or a lower surface of an edge portion of the window base, and wherein heating the substrate further comprises focusing a second portion of the first light and a second portion of the second light via the edge lens through the window onto the edge portion of the substrate.

14. A substrate heating apparatus comprising:
a support shaft extending in a first direction;
a chuck stage disposed on and coupled to the support shaft;
a plurality of heating lamps disposed on the chuck stage; and
a window disposed on the chuck stage, the window including a window base and a central lens disposed in a surface of the window base, wherein the central lens at least partially overlaps the support shaft in the first direction and wherein the chuck stage and the window are each configured to support a substrate above the plurality of heating lamps,
wherein the plurality of heating lamps are configured to heat the substrate by emitting light through the window onto the substrate, and
wherein the central lens is configured to focus a portion of the light onto the central portion of the substrate.

15. The substrate heating apparatus according to claim 14, wherein the window further includes an edge lens disposed in a surface of an edge portion of the window base, and wherein the edge lens is configured to focus a second portion of the light onto the edge portion of the substrate.

16. The substrate heating apparatus according to claim 15, wherein the edge lens has a ring shape.

17. The substrate heating apparatus according to claim 14, wherein the central lens has a circular shape.

18. The substrate heating apparatus according to claim 14, wherein the window base has a ring shape and the central lens extends in a circumferential direction and surrounds the central portion of the window base.

19. The substrate heating apparatus according to claim 14, wherein the window base includes a horizontal portion extending in a second direction crossing the first direction and a support portion extending in the first direction from the horizontal portion and supported by the chuck stage, and wherein an inner corner of the window base joining the horizontal portion and the support portion includes a curved surface having a radius of curvature of less than 0.5 mm.

20. The substrate heating apparatus according to claim 14, wherein the window base includes a horizontal portion extending in a second direction crossing the first direction and a support portion extending in a third direction from the horizontal portion and supported by the chuck stage, wherein the third direction crosses the first direction and the second direction.

* * * * *